United States Patent [19]

Miller et al.

[11] Patent Number: 4,476,429
[45] Date of Patent: Oct. 9, 1984

[54] HIGH VOLTAGE BUBBLE MEMORY PULSE GENERATOR OUTPUT STAGE

[75] Inventors: Ira Miller, Tempe; Robert N. Dotson, Mesa; Robert B. Davies, Tempe, all of Ariz.

[73] Assignee: Motorola, Inc., Schaumburg, Ill.

[21] Appl. No.: 412,070

[22] Filed: Aug. 27, 1982

[51] Int. Cl.$^3$ .............................................. G05F 5/00
[52] U.S. Cl. .................................... 323/299; 323/350; 323/271
[58] Field of Search ............... 323/268, 271, 349, 350, 323/351, 299

[56] References Cited

U.S. PATENT DOCUMENTS 3,202,904  8/1965  Madland ............................ 323/350
3,488,562  1/1970  Rovell .............................. 323/268 X
3,622,865  11/1971 Lee, Jr. ............................. 323/351
4,355,277  10/1982 Davis et al. ...................... 323/285 X

*Primary Examiner*—Peter S. Wong
*Attorney, Agent, or Firm*—Vincent B. Ingrassia

[57] ABSTRACT

A circuit for providing the gate of a bubble memory with a precision current pulse at a high voltage is manufactured using a low voltage process; i.e. $BV_{ceo}$ is approximately 18 volts. In order to accomplish this, first and second voltage level shifting stages are cascoded and the output transistors thereof are used as Zener level shifters each level shifting downward by a $BV_{ceo}$ when only a small voltage is dropped across the load. If the voltage drop across the load increases, the cascoded output transistors may enter their active region and are prevented from going into saturation by saturation clamps so as to not introduce unwanted delays in the rise or fall times of the current pulse.

11 Claims, 1 Drawing Figure

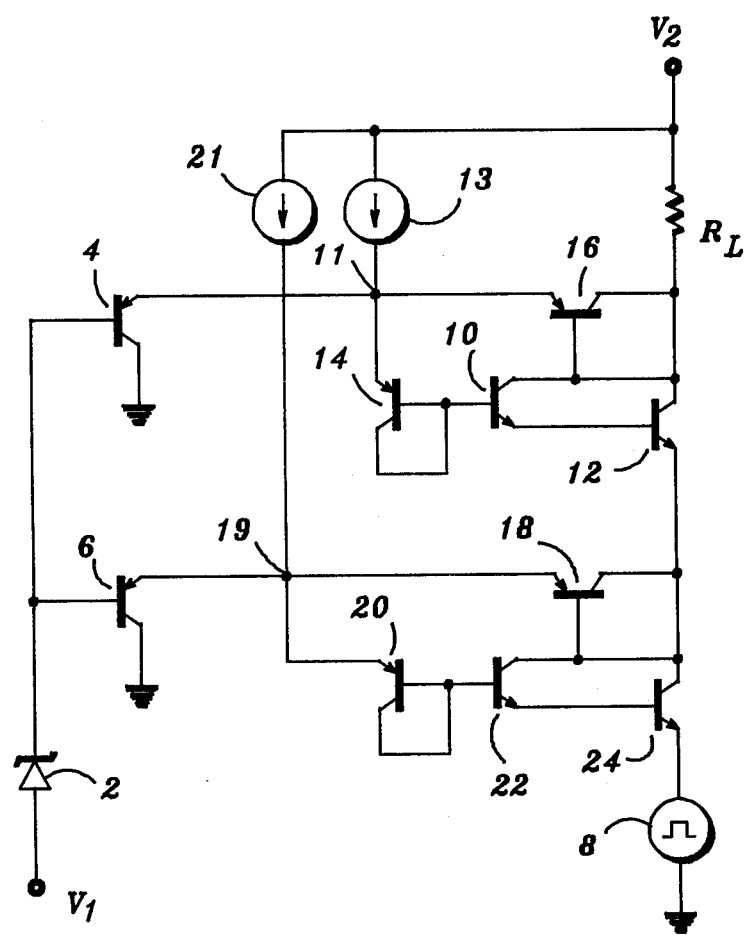

HIGH VOLTAGE BUBBLE MEMORY PULSE GENERATOR OUTPUT STAGE

BACKGROUND OF THE INVENTION

The invention relates generally to pulse generators and, more particularly, to a circuit for generating a precision current pulse comprising transistors having a breakdown voltage which is substantially lower than the upper end of a relatively large output voltage swing.

It is well known that it is necessary to supply a precision current pulse to the replicative coil of a bubble memory. Sometimes, it is also necessary that the current pulse be generated by a circuit having a large output voltage swing (e.g. 3–50 volts). This latter requirements generally requires a high supply voltage and, in the case of a monolithic circuit, transistors with a high $BV_{ceo}$ (collector-emitter breakdown voltage with an open base). In turn, a high $BV_{ceo}$ requires thicker epitaxial layers of high resistivity resulting in wider depletion spreads for a given voltage. This undesirably increases die size. To render the situation even more complex, some manufacturing processes currently being employed by semiconductor manufacturers are low voltage processes (i.e. $BV_{ceo}$ is approximately 18 volts) suitable, for example, in the manufacture of digital integrated circuits.

SUMMARY OF THE INVENTION

It is an object of the present invention to provide an improved circuit for delivering a precision current pulse to the replicative coil of a bubble memory.

It is a further object of the present invention to provide a monolithic integrated circuit for supplying the precision current pulse to the replicative coil of a bubble memory which avoids the need for thick epitaxial layers of high resistivity.

It is a still further object of the present invention to provide a monolithic integrated circuit for supplying a precision high voltage current pulse to the replicative coil of a bubble memory which avoids the introduction of excessive delays.

Yet another object of the present invention is to provide a monolithic integrated circuit for supplying a precision current pulse from a high voltage source, which integrated circuit is manufactured using a low voltage process.

According to a broad aspect of the invention there is provided a monolithic integrated circuit for receiving a high voltage and generating therefrom a substantially lower voltage at a node, comprising: first means for generating a reference voltage; and at least one voltage level shifting stage including an output transistor having a collector coupled to said high voltage, an emitter coupled to said node, and having a base, said output transistor for acting as a $BV_{ceo}$ level shifter when the collector-emitter voltage reaches $BV_{ceo}$ where $BV_{ceo}$ is the transistor's collector-emitter breakdown voltage with an open base, and for providing a predetermined level shift substantially less than $BV_{ceo}$ when the collector-emitter voltage falls to said predetermined level, and for operating in its active region when its collector-emitter voltage is between $BV_{ceo}$ and said predetermined level.

According to the further aspect of the invention there is provided a circuit for presenting a voltage below a predetermined value to a current pulse generator, which generator supplies a current pulse to a load coupled between said circuit and a source of supply voltage substantially greater than said predetermined value, comprising: first means for generating a reference voltage; and at least one voltage level shifting stage coupled between said load and said current pulse generator, said at least one voltage level shifting stage including an output transistor having a collector coupled to said load, an emitter coupled to said node, and having a base for receiving base drive, said output transistor for acting as a $BV_{ceo}$ level shifter when its collector-emitter's voltage reaches $BV_{ceo}$ where $BV_{ceo}$ is a transistor's collector-emitter breakdown voltage with an open base, and for providing a predetermined level shift substantially less than $BV_{ceo}$ when its collector-emitter voltage falls to said predetermined level, and for operating in its active region when its collector-emitter voltage is between $BV_{ceo}$ and said predetermined level.

BRIEF DESCRIPTION OF THE DRAWING

The above and other objects, features, and advantages of the present invention will be more clearly understood from the following detailed description taken in conjunction with the accompanying drawing which is a schematic diagram of the inventive current pulse generating circuit.

DESCRIPTION OF THE PREFERRED EMBODIMENT

The inventive circuit shown on the drawing includes a reference voltage generating section, and first and second level shifting stages coupled between a source of precision current pulses 8 and a load $R_L$.

The reference voltage generating section includes a Zener diode 2 having an anode coupled to a source of supply voltage $V_1$ (e.g. 5 volts) and a cathode coupled to the base electrodes of PNP transistors 4 and 6 each having a collector coupled to ground. The emitter of transistor 4 is coupled to node 11 in the first level shifting stage for establishing a reference voltage at node 11. This reference voltage may, for example, be approximately 13 volts depending on the value of $V_1$ and the Zener diode selected. Similarly, the emitter of transistor 6 is coupled to node 19 in the second level shifting stage for producing a similar reference voltage at node 19.

The first voltage level shifting stage comprises a pair of NPN transistors 10 and 12 coupled in a Darlington configuration. A PNP transistor 14 is coupled as a diode between node 11 and the base of drive transistor 10. A PNP transistor 16 has an emitter coupled to node 11, a collector coupled to the collectors of transistors 10 and 12 and a base coupled to the collectors of transistors 10 and 12. Transistor 16 functions as a saturation clamp as will be described hereinbelow. Current is supplied to this first voltage level shifting stage by means of a current source 13 coupled between node 11 and a second source of supply voltage $V_2$ (e.g. 50 volts) which may be generated on or off chip.

A second current source 21 adapted to be coupled to $V_2$ supplies current to node 19 in the second voltage level shifting stage. This second stage includes a second pair of NPN transistors 22 and 24 coupled in a Darlington configuration, a PNP transistor 20 coupled as a diode between node 19 and the base of drive transistor 22, and an additional PNP transistor 18 having an emitter coupled to node 19, a collector coupled to the collectors of transistors 22 and 24 and a base coupled to the collectors of transistors 22 and 24, which transistor 18 also serves as a saturation clamp.

As should be apparent, transistors 12 and 24 are coupled in a cascode configuration between a current source 8 which supplies precision current pulses and a load $R_L$ which is also coupled to $V_2$. Load $R_L$ may be an external load and located off chip.

If we assume that the circuit is to be manufactured using an 18 volt process and given the fact that current source 8 must supply precision current pulses. Then it is necessary that the voltage at the collector of the output transistor (not shown) in current source 8 not exceed 18 volts, and that the rise and fall times of the current pulse be minimized. This can be accomplished if (i) the voltage at the emitter of transistor 24 has an upper limit of 18 volts which corresponds to the breakdown voltage ($BV_{ceo}$) of each of the transistors in the circuit and those in the current source 8 and (ii) output transistors 10, 12, 22 and 24 are prevented from going into saturation.

The load resistor $R_L$ represents, in this case, the gate of a bubble memory. As stated previously, it is necessary that a precision current pulse be supplied to $R_L$ by current source 8. This means that the voltage on the collector of the output transistor in current source 8 should not exceed its $BV_{ceo}$ (e.g. 18 volts). Thus, the voltage at the emitter of transistor 24 must not exceed 18 volts. This is accomplished as described hereinbelow.

We have already assumed that $V_1$ is approximately 5 volts, $V_2$ is approximately 50 volts, and a Zener diode 2 is chosen such that a voltage of approximately 13 volts appears at nodes 11 and 19 (the emitter of transistors 4 and 6 respectively). Starting with the assumption that current source 8 is generating no current and that the only current flowing through $R_L$ is a very small leakage current, then, the voltage drop across $R_L$ is substantially zero and 50 volts appears at the collector and base of transistor 16 and at the collectors of transistors 10 and 12. Transistors 4 and 6 act as followers to clamp the voltage at nodes 11 and 19 to approximately 13 volts. Thus, the emitters of transistors 14, 16, 18, and 20 are at 13 volts. This being the case, transistor 14 is reverse biased and transistor 16 is off.

With 50 volts at the collector of transistor 12, transistor 12 will be in break-down and the voltage between its collector and emitter will be equivalent to its $VB_{ceo}$ (18 volts). Thus, the voltage at the emitter of transistor 12 will be approximately 32 volts. This is true since transistor 14 is reverse biased and no base current is being supplied to transistors 10 or 12. Thus, transistor 12 appears as a Zener level shift which shifts the voltage at its collector by an amount equivalent to its $BV_{ceo}$.

Transistor 18 is off and transistor 20 is reverse biased. Thus, no base drive is applied to transistor 22 or 24. Transistor 24 with 32 volts at its collector goes into breakdown and the voltage which appears at its emitter is approximately equal to 14 volts. Thus, the voltage at the collector of the ouptut transistor in current source 8 is 14 volts, well below its breakdown voltage thus permitting current source 8 to be accurately controlled.

When current source 8 begins to turn on, transistors 12 and 24 remain in breakdown and continue to act as Zener level shifters as the voltage drop across load $R_L$ increases. As the voltage across load $R_L$ increases, the voltage at the collectors of transistors 12 and 24 will fall. When the voltage at the emitter of transistor 24 falls sufficiently ($3V_{BE}$ below 13 volts where $V_{BE}$ is the base-emitter voltage), transistor 20 will begin to conduct supplying base drive to transistor 22 which in turn drives transistor 24. Thus, transistors 22 and 24 enter a normal forward active mode of operation and the voltage at the emitter of transistor 24 will cease falling.

When the voltage at the collector of transistor 24 reduces sufficiently ($2V_{BE}$ between its emitter and collector), transistor 18 will turn on diverting current from the emitter of transistor 20 and therefore reducing base drive to transistors 22 and 24. This clamps the voltage across the collector-emitter of transistor 24 to $2V_{BE}$ and prevents transistor 22 and 24 from going into saturation. Thus, transistor 18 acts as a saturation clamp to render transistor 24 a $2V_{BE}$ level shifter.

Similarly, when the voltage at the emitter of transistor 12 drops sufficiently ($3V_{BE}$ below 13 volts), transistor 14 becomes forward biased and supplies base drive to transistor 10 which turns transistor 12 on. When the voltage between the collector-emitter of transistor 12 is $2V_{BE}$, transistor 16 will turn on diverting current from the emitter of transistor 14 and clamping the voltage between the collector-emitter of transistor 12 to $2V_{BE}$.

As should be apparent, the voltage at the emitter of transistor 24 is now approximately 9 volts, again lower than the breakdown voltage of the output transistor of current source 8. It should further be apparent that since transistors 10, 12, 22 and 24 are prevented from going into saturation by saturation clamp transistors 16 and 18 respectively, the delays associated with bringing these transistors out of saturation are eliminated.

As the current being generated by current source 8 decreased, the process is reversed until nothing but leakage current flows through load $R_L$ at which point transistors 12 and 24 each become Zener level shifters at their breakdown voltage $BV_{ceo}$.

The above description is given by way of example only. Changes in form and details may be made by one skilled in the art without departing from the scope of the invention.

We claim:

1. A monolithic integrated circuit for receiving a high voltage and generating therefrom a substantially lower voltage at a node, comprising:
   first means for generating a reference voltage; and
   at least one voltage level shifting stage including an output transistor having a collector coupled to said high voltage, an emitter coupled to said node, and having a base, said output transistor for acting as a $BV_{ceo}$ level shifter when the collector-emitter voltage reaches $BV_{ceo}$ where $BV_{ceo}$ is the transistor's collector-emitter breakdown voltage with an open base, and for providing a predetermined level shift substantially less than $BV_{ceo}$ when the collector-emitter voltage falls to said predetermined level, and for operating in its active region when its collector-emitter voltage is between $BV_{ceo}$ and said predetermined level.

2. A circuit according to claim 1 wherein said voltage level shifting stage further includes diode means coupled between said first means and the base of said output transistor which is reverse biased when the voltage at the emitter of said output transistor is above said reference voltage less a predetermined amount and becomes forward biased when the voltage at the emitter of said output transistor is less than said reference voltage by a predetermined amount so as to supply base current to said output transistor.

3. A circuit according to claim 2 wherein said voltage level shifting stage further includes a drive transistor coupled between said diode means and said output transistor in Darlington pair forming relationship with said output transistor, said drive transistor having a base coupled to said diode means, a collector coupled to the collector of said output transistor and an emitter coupled to the base of said output transistor.

4. A circuit according to claim 3 wherein said voltage level shifting stage further comprises a saturation clamp coupled to said first means, to said drive transistor, and to said output transistor, to limit the voltage between the collector-emitter of said output transistor to said predetermined amount when the output transistor is operating in its active mode so as to prevent said drive transistor and said output transistor from going into saturation.

5. A circuit according to claim 4 wherein said saturation clamp is a first transistor having an emitter coupled to said reference voltage, and a collector and base coupled to the collectors of said output and drive transistors.

6. A circuit according to claim 5 wherein said diode means comprises a second transistor having an emitter coupled to said reference voltage and having a base and collector coupled to the base of said drive transistor.

7. A circuit for presenting a voltage below a predetermined value to a current pulse generator, which generator supplies a current pulse to a load coupled between said circuit and a source of supply voltage substantially greater than said predetermined value, comprising:

first means for generating a reference voltage; and at least one voltage level shifting stage coupled between said load and said current pulse generator, said at least one voltage level shifting stage including an output transistor having a collector coupled to said load, an emitter coupled to said load, and having a base for receiving base drive, said output transistor for acting as a $BV_{ceo}$ level shifter when its collector-emitter's voltage reaches $BV_{ceo}$ where $BV_{ceo}$ is a transistor's collector-emitter breakdown voltage with an open base, and for providing a predetermined level shift substantially less than $BV_{ceo}$ when its collector-emitter voltage falls to said predetermined level, and for operating in its active region when its collector-emitter voltage is between $BV_{ceo}$ and said predetermined level.

8. A circuit according to claim 7 wherein said voltage level shifting stage further includes diode means coupled between said first means and the base of said output transistor which is reversed biased when the voltage at the emitter of said output transistor is above said reference voltage less a predetermined amount and becomes forward biased when the voltage at the emitter of said output transistor is less than said reference voltage by a predetermined amount so as to supply base drive to said output transistor.

9. The circuit according to claim 8 wherein said at least one voltage level shifting stage further includes a drive transistor coupled between said diode means and said output transistor in Darlington pair forming relationship with said output transistor, said drive transistor having a base coupled to said diode means, a collector coupled to the collector of said output transistor and an emitter coupled to the base of said output transistor.

10. A circuit according to claim 9 wherein said at least one voltage level shifting stage further includes a saturation clamp coupled to said first means, said drive transistor and said output transistor to limit the voltage between the collector-emitter of said output transistor to said predetermined amount when said output transistor operating in its active mode so as to prevent said output transistor and said drive transistor from going into saturation.

11. A circuit according to claim 10 wherein said saturation clamp is a first transistor having an emitter coupled to said reference voltage, a collector coupled to the collector of said output transistor and a base coupled to the collector of said drive transistor.

* * * * *